United States Patent [19]

Sonoda et al.

[11] 4,258,080

[45] Mar. 24, 1981

[54] METHOD OF LOWERING RESISTIVITY OF METAL OXIDE SEMICONDUCTOR POWDER

[75] Inventors: Nobuo Sonoda; Wataru Shimotsuma; Yoshio Kishimoto; Yoichi Sekine, Japan

[73] Assignee: Matsushita Electric Industrial Co., Ltd., Osaka, Japan5n

[21] Appl. No.: 958,498

[22] Filed: Nov. 7, 1978

[30] Foreign Application Priority Data

Nov. 8, 1977 [JP] Japan .................. 52/134191

[51] Int. Cl.³ ............................................ B05D 5/12
[52] U.S. Cl. .................................. 427/82; 252/518; 357/10; 427/85; 427/87; 427/215; 427/427; 427/443.2; 427/399; 427/108
[58] Field of Search ............. 357/10; 427/82, 87, 427/108, 215, 85, 427, 399, 443.2; 252/518

[56] References Cited

U.S. PATENT DOCUMENTS

| | | | |
|---|---|---|---|
| 3,428,907 | 2/1969 | Crisler | 357/10 |
| 3,441,517 | 4/1969 | Brauer et al. | 357/10 |
| 3,503,029 | 3/1970 | Matsuoka | 357/10 |
| 3,586,534 | 6/1971 | Niha et al. | 357/10 |
| 3,625,756 | 12/1971 | Taguchi et al. | 427/87 |
| 3,658,583 | 4/1972 | Ogawa et al. | 427/87 |
| 3,658,725 | 4/1972 | Masugama et al. | 357/10 |
| 3,778,743 | 12/1973 | Matsuoka et al. | 252/518 |

FOREIGN PATENT DOCUMENTS

| | | | |
|---|---|---|---|
| 869860 | 6/1961 | United Kingdom | 357/10 |
| 1005246 | 9/1965 | United Kingdom. | |
| 1114509 | 5/1968 | United Kingdom. | |
| 1326377 | 8/1973 | United Kingdom. | |

OTHER PUBLICATIONS

"Zinc Oxide Rediscovered", New Jersey Zinc Co., 1957, pp. 28–34.
Loch, "The Semiconducting Nature of Stannic Oxide", The Carborundum Company, Niagara Falls, New York (1963).
Nagasawa et al., "Electrical and Optical Properties of Reduced Stannic Oxide Crystals", Jap. Journal of Applied Physics, vol. 10, No. 4, Apr. 1971.
Kirk–Othmer Encyclopedia of Chemical Technology, vol. 17, pp. 342–347, John Wiley & Sons, 1968.

*Primary Examiner*—John D. Smith
*Attorney, Agent, or Firm*—Lowe, King, Price & Becker

[57] ABSTRACT

The resistivity of an n-type metal oxide semiconductor such as $SnO_2$, $In_2O_3$ or $ZnO$ is lowered by treating the metal oxide with a metal halide such as $SnX_2$ or $SbX_3$, in which the oxidation number of the metal is smaller than the largest oxidation number the metal can take, so as to allow the metal oxide to generally uniformly come into contact with the metal halide. The treatment can be done at room temperature by, for example, the use of a solution of the metal halide and does not cause discoloration of the treated metal oxide. This process is applicable also to a conductive material comprising as its essential component at least one n-type metal oxide semiconductor.

7 Claims, No Drawings

METHOD OF LOWERING RESISTIVITY OF METAL OXIDE SEMICONDUCTOR POWDER

BACKGROUND OF THE INVENTION

This invention relates to a method of lowering the resistivity of an n-type metal oxide semiconductor or a conductive material which comprises as its essential component at least one n-type metal oxide semiconductor.

As is known, it is possible to lower the resistivity of an n-type metal oxide semiconductor useful as a conductor material in various electric and electronic devices either by a valence control technique, i.e. doping of the metal oxide with a metal element whose valence number is larger than that of the metal in the oxide by one, or by heat treatment in vacuum to increase oxygen defects of the metal oxide utilizing the n-type characteristic of the oxide. In either of these conventional methods there is the necessity for establishment of a high temperature atmosphere or a high temperature high vacuum condition by the use of a precisely controllable electric furnace or a vacuum furnace of a complicated construction. Also it is necessary to strictly control the amount of a dopant. Besides, lowering of the resistivity of a white or lightly colored metal oxide semiconductor by doping is almost inevitably accompanied by a change in color of the metal oxide from the inherent color to a different and deeper color, and such discoloration becomes more significant as the amount of the dopant is increased. This phenomenon is quite undesirable from an industrial viewpoint.

SUMMARY OF THE INVENTION

It is an object of the present invention to provide a method of lowering the resistivity of an n-type metal oxide semiconductor, or a conductive material comprising as its essential component at least one n-type metal oxide semiconductor, which method can be performed under normal temperature and pressure conditions and does not cause discoloration of the metal oxide semiconductor.

According to a method of the invention, the resistivity of an n-type metal oxide semiconductor is lowered by treating the metal oxide semiconductor with a metal halide, in which the oxidation number of the metal is smaller than the largest oxidation number the metal can take, at a temperature below the thermal decomposition temperature of the metal halide so as to allow the metal oxide to generally uniformly come into contact with the metal halide.

This method is applicable also to a conductive material which comprises as its essential component at least one n-type metal oxide semiconductor.

In the following description, "metal oxide" refers to n-type metal oxide semiconductor unless otherwise noted, and metal halide according to the above definition will be called "unsaturated metal halide" for the sake of convenience.

The metal halide treatment of a metal oxide (or a conductive material according to the above definition) in a method of the invention is utterly different from a high temperature treatment (firing) for doping by the conventional valence control technique. The treatment according to the invention can be done at or in the vicinity of room temperature although it is optional to employ higher temperatures on the condition that the metal halide is not heated to its thermal decomposition temperature. In the present invention, it is important that a metal oxide (or conductive material) subject to the treatment is brought into good and generally uniform contact with an unsaturated metal halide. One practical method for establishment of such contact between the two substances is to mix the metal oxide with the metal halide both in solid phase, e.g. in powder form. Exposure of the metal oxide to a vapor of the metal halide is conceivable as another contacting method but is unsuitable for the method of the invention since a portion of the metal halide will undergo decomposition during vaporization. Considering both from the efficiency of the contact and easiness of practical operation, the most preferable contacting method is to allow the metal oxide to come into contact with a solution of the metal halide. Typical embodiments of this contacting method are immersion of the metal oxide in a solution of the metal halide and application of the solution to the metal oxide, for example, by spraying.

Tin dioxide (stannic oxide) $SnO_2$, diindium trioxide $In_2O_3$ and zinc oxide $ZnO$ are typical examples of metal oxides to be treated according to the invention. The merit of a method of the invention is particularly distinctive when applied to any of these three metal oxides because lowering of the resistivity of the treated metal oxide can be achieved with the maintenance of a light (white or yellow) color of the metal oxide.

A variety of unsaturated metal halides are useful in a method of the invention, but the use of a tin halide having two halogen atoms or an antimony halide having three halogen atoms is the most preferable.

DESCRIPTION OF THE PREFERRED EMBODIMENTS

The invention will be illustrated by the following examples.

EXAMPLE 1

In this example three kinds of metal oxides, tin dioxide, diindium trioxide and zinc oxide all commercially available as reagents (special grade) in fine powder form, were each treated with stannous fluoride $SnF_2$, an unsaturated metal halide. Aqueous solutions of stannous fluoride were prepared in various concentrations such that $SnF_2$ in each solution amounted to 0.1, 1.0 or 10.0 mol% of the quantity of a metal oxide ($SnO_2$, $In_2O_3$ or $ZnO$) to be treated with that solution, and the three kinds of metal oxides were each and separately immersed in each of the 0.1, 1.0 and 10.0 mol% stannous fluoride solutions at room temperature. Each sample of the metal oxides was kept immersed in each solution for about 5 min with continued stirring, then separated from the solution by filtration and thereafter dried for 2 hr at 60° C.

For each of the thus treated metal oxide powder samples, specific resistivity $\rho$ was measured by putting 0.6 g of each sample powder into an insulating and cylindrical tube having an inner diameter of 6 mm and compressing the sample powder at a pressure of 70 kg/cm$^2$ with cylindrical platinum electrodes fitted into the tube from both sides of the sample. Table 1 presents experimental data obtained in this example. (The data in the rank of 0% $SnF_2$ were obtained for the metal oxides not treated with any solution.)

TABLE 1

| Quantity of SnF$_2$ (mol %) | SnO$_2$ Color | SnO$_2$ $\rho$ ($\Omega$cm) | In$_2$O$_3$ Color | In$_2$O$_3$ $\rho$ ($\Omega$cm) | ZnO Color | ZnO $\rho$ ($\Omega$cm) |
|---|---|---|---|---|---|---|
| 0 | white | $5.1 \times 10^5$ | light yellow | $4.9 \times 10^5$ | white | $2.4 \times 10^7$ |
| 0.1 | light gray | $2.2 \times 10^3$ | light yellow | $1.2 \times 10^5$ | white | $3.4 \times 10^6$ |
| 1.0 | light gray | $1.1 \times 10^2$ | light yellow | $3.3 \times 10$ | white | $3.9 \times 10^4$ |
| 10.0 | gray | $1.1 \times 10$ | light yellow | $6.2 \times 10^{-1}$ | white | $2.8 \times 10^6$ |

As can be seen in Table 1, the treatment with a stannous fluoride solution resulted in noticeable lowering of the specific resistivity $\rho$ for every one of the tested metal oxides and, when a sufficiently large quantity was used, the effect of this metal halide was most significant on diindium trioxide. For either of tin dioxide and diindium trioxide the specific resistivity $\rho$ became lower with increase in the quantity of stannous fluoride contacted the metal oxide, but the data for zinc oxide implies the existence of a minimum value for $\rho$ when this oxide is treated with a stannous fluoride solution.

Diindium trioxide and zinc oxide treated in this example exhibited no perceptible change in their color, but tin dioxide, which was treated similarly, distinctly changed its color and became gray. However, we presumed that the commercial tin dioxide used in this example contained a very small amount of metastannic acid SnO$_2$.nH$_2$O and that the gray coloring of the treated tin dioxide samples was attributable to the discoloration of the metastannic acid to a black color upon contact with stannous fluoride. Commercial tin dioxide is usually prepared by firing in air of metastannic acid which is obtained by treatment of metallic tin with nitric acid, so that a small amount of metastannic acid may remain in the product in case of insufficiency of the firing for dehydration. The presumption was verified by experiments. First, it was confirmed that metastannic acid, a white substance, turned black by treatment with a dilute aqueous solution of stannous fluoride. Next, Example 1 was repeated with respect to tin dioxide but that, before immersion in the stannous fluoride solutions, the commercial tin dioxide was fired in air for 5 hr at 1200° C. with the aim of completing the conversion of metastannic acid to tin dioxide. In this time tin dioxide did not change in white color at all, even when treated with the 10 mol% stannous fluoride solution, though there occurred lowering of the specific resistivity $\rho$ numerically in agreement with the result shown in Table 1.

Thus it was confirmed that tin dioxide, like diindium trioxide and zinc oxide, maintains its inherent (white) color when this oxide exhibits a remarkable lowering of its resistivity upon contact with stannous fluoride.

EXAMPLE 2

The effects of various halides of tin and antimony on the commercial tin dioxide, diindium trioxide and zinc oxide used in Example 1 were examined in this example. Stannous fluoride SnF$_2$, stannous chloride SnCl$_2$, stannous bromide SnBr$_2$, stannous iodide SnI$_2$, antimony trifluoride SbF$_3$, antimony trichloride SbCl$_3$, antimony tribromide SbBr$_3$ and antimony triiodide SbI$_3$ were each dissolved in water or methanol such that an unsaturated halide of tin or antimony in each solution amounted to 1.0 mol% of the quantity of a metal oxide (SnO$_2$, I$_2$O$_3$ or ZnO) to be treated with that solution. The three kinds of metal oxides were individually treated with the solutions thus prepared in accordance with Example 1, and measurement of specific resistivity was made by the method mentioned in Example 1.

Table 2 presents experimental results obtained in Example 2.

TABLE 2

| | Specific Resistivity ($\Omega$cm) | | |
|---|---|---|---|
| | SnO$_2$ | In$_2$O$_3$ | ZnO |
| before treatment | $5.1 \times 10^5$ | $4.9 \times 10^5$ | $2.4 \times 10^7$ |
| SnF$_2$ | $1.1 \times 10$ | $3.3 \times 10$ | $3.9 \times 10^4$ |
| SnCl$_2$ | $2.6 \times 10^2$ | $9.8 \times 10$ | $8.3 \times 10^4$ |
| SnBr$_2$ | $2.1 \times 10$ | $1.5 \times 10$ | $1.6 \times 10^5$ |
| SnI$_2$ | $9.3 \times 10$ | $4.6 \times 10$ | $4.8 \times 10^4$ |
| SbF$_3$ | $4.1 \times 10^2$ | $8.8 \times 10^2$ | $9.4 \times 10^4$ |
| SbCl$_3$ | $8.3 \times 10^2$ | $1.4 \times 10^3$ | $8.3 \times 10^4$ |
| SbBr$_3$ | $1.4 \times 10^2$ | $5.6 \times 10^2$ | $3.4 \times 10^5$ |
| SbI$_3$ | $3.9 \times 10^2$ | $8.4 \times 10^2$ | $7.8 \times 10^4$ |

EXAMPLE 3

The three kinds of metal oxides used in Examples 1 and 2 were each wetted with the metal halide solutions prepared in Example 2 by spraying of each solution to each metal oxide in powder form. The wetted metal oxide powders were dried immediately and thereafter subjected to the measurement of specific resistivity according to Example 1. It was revealed that the metal oxide samples treated in this example exhibited changes (lowering) in their specific resistivity generally similarly to the samples treated in Example 2.

EXAMPLE 4

Tin dioxide, diindium trioxide and zinc oxide (all in powder form) were each dispersed in water or methanol, followed by the addition of a small amount of polyvinyl alcohol (PVA, as a binder) and one of the unsaturated metal halides listed in Example 2 to each dispersion. A thin film was formed on a substrate such as paper by applying each of the metal oxide dispersions (in metal halide solution) onto a surface of the substrate, followed by drying. For comparison, a similar coating essentially of a metal oxide was formed by the same procedure but without using any metal halide. For each metal oxide, the surface resistivity $\rho_s$ of the film formed by the use of an unsaturated metal halide was distinctly lower than that of the film formed without using any metal halide.

Numerical values for the combination of diindium trioxide and stannous fluoride were as follows:

| Dispersion A: | |
|---|---|
| Diindium trioxide | 50 g |
| Water | 50 g |
| Aqueous solution of PVA (10 wt. %) | 5 g |
| Stannous fluoride | 0.32 g |

| Dispersion B: | |
|---|---|
| Diindium trioxide | 50 g |
| Water | 50 g |

-continued

| Dispersion B: | |
|---|---|
| The PVA solution | 5 g |

Each of the dispersions A and B was coated on one side of slick paper and dried to form a 10 μm thick film. The film formed by the use of the dispersion A had a surface resistivity of 86 KΩ, whereas the other film formed by the use of the dispersion B had a surface resistivity of 20 MΩ.

EXAMPLE 5

A glass plate coated (by vacuum deposition) with a transparent and conductive thin film of tin dioxide and another glass plate coated (by vacuum deposition) with a transparent and conductive thin film of diindium trioxide were immersed in a 10 Wt% solution of stannous fluoride for 30 min and then dried at room temperature. The surface resistivity $\rho_s$ of each coating was measured before and after the treatment with the stannous fluoride solution. As shown in Table 3, this treatment caused an appreciable lowering of $\rho_s$ for either of the tin dioxide coating and diindium trioxide coating.

TABLE 3

| | Surface Resistivity, $\rho_{s\,(\Omega)}$ | |
|---|---|---|
| | Before Treatment | After Treatment |
| Tin dioxide Coating | 1050 | 900 |
| Diindium trioxide Coating | 50 | 45 |

EXAMPLE 6

A method of the invention is applicable also to a conductive material which is essentially a metal oxide but comprises a small amount of a dopant introduced by a conventional technique such as a valence control technique. Such a conductive material is lower in resistivity than the original metal oxide, but it is possible to further lower the resistivity by treating the conductive material with an unsaturated metal halide. Table 4 shows examples of applications of a method of the invention to metal oxides already subjected to doping by the valence control technique. The stannous fluoride treatment was performed by the use of an aqueous solution of $SnF_2$ amounting to 1.0 mol% of the quantity of $SnO_2$ or $In_2O_3$ to be treated.

TABLE 4

| | $SnO_2$ | | $In_2O_3$ | |
|---|---|---|---|---|
| | Color | $\rho$ (Ωcm) | Color | $\rho$ (Ωcm) |
| No Treatment | white | $5.1 \times 10^5$ | light yellow | $4.9 \times 10^5$ |
| After Doping by Valence Control | (doped with 0.1 mol % Sb) | | (doped with 1.0 mol % Sn) | |
| | light blue | $7.2 \times 10$ | light green | $1.1 \times 10$ |
| After Treatment with $SnF_2$ | light blue | $4.5 \times 10^{-1}$ | light green | $1.3 \times 10^{-1}$ |

Other than the three kinds of metal oxides used in the above examples, titanium dioxide $TiO_2$, divanadium pentoxide $V_2O_5$ and manganese dioxide $MnO_2$ are examples of n-type metal oxide semiconductors for which a method of the invention is effective. Cuprous chloride CuCl and ferrous chloride $FeCl_2$ are additional examples of unsaturated metal halides useful in a method of the invention. There occurred some lowering of specific resistivity also when any of the additionally mentioned metal oxides was treated with cuprous chloride or ferrous chloride. However, the effect of a method according to the invention is particularly great when embodied in the treatment of tin dioxide, diindium trioxide or zinc oxide with one of the eight kinds of metal halides employed in Example 2.

It was confirmed that the treatment of an n-type metal oxide semiconductor with a "saturated metal halide" (in which the metal takes the largest oxidation number) such as a stannic halide does not cause any lowering of the resistivity of the metal oxide.

The reason for lowering of the resistivity of an n-type metal oxide semiconductor by treatment with an unsaturated metal halide has not been clarified in detail. Presumably, the effect of such treatment is attributable to one, or more, of the following types of actions of an unsaturated metal halide on a metal oxide.

(1) A reducing action of an unsaturated metal halide to the effect of increasing oxygen defects in an n-type metal oxide semiconductor.

(2) An ionic action to the effect of increasing the quantity of free electrons in the metal oxide as a result of the introduction of a foreign metal element having a valence number larger than the valence number of the metal in the oxide by one (valence control for metal ions).

(3) An ionic action to the effect of increasing the quantity of free electrons in the metal oxide as a result of partial substitution of a halogen (whose valence is smaller than that of oxygen by one) for oxygen in the oxide (valence control for oxygen ions).

With respect to the treatment of $I_2O_3$ with $SnF_2$, these three types of actions may be illustrated as follows.

(1) An increase occurs in oxygen defects in $I_2O_3$ by a reducing action of $SnF_2$.

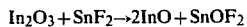

(2) An increase in the quantity of free electrons resulting from substitution of $Sn^{4+}$ ions formed by the action (1) for $In^{3+}$ ions in $In_2O_3$.

(3) An increase in the quantity of free electrons resulting from substitution of $F^-$ ions of $SnF_2$ for $O^{2-}$ ions in $In_2O_3$.

Probably, a joint effect produced by these phenomena (1), (2) and (3) is the cause for a great lowering of specific resistivity of $In_2O_3$ treated with $SnF_2$. Also for any other combination of the metal oxides and unsaturated metal halides mentioned hereinbefore, it will be justifiable to consider that lowering of the resistivity is attributable to at least one of the above discussed three types of actions.

The resistivity-lowering effect of a metal halide treatment according to the invention is particularly eminent when an n-type metal oxide semiconductor is subjected to the treatment in fine powder form. This can be explained by considering that the effect is produced mainly on the particle surfaces of the treated metal oxide. As will be understood, the specific resistivity $\rho$ of a metal oxide powder is dominantly governed by contact resistances produced at the boundaries of fine particles though the internal resistance of the individual particles makes a minor contribution to the resistivity $\rho$ of the powder. Particularly in the case of an n-type metal oxide semiconductor powder, the surface of each particle exposed to air is liable to assume a state of excess in oxygen. This means that each particle of the powder has a high resistance surface layer. In a method of the invention, an unsaturated metal halide exerts its action on the surfaces of the individual particles of a metal oxide powder with the effect of reducing the contact resistance in each boundary area between the particles. As a consequence, the metal oxide powder as a whole exhibits a noticeable lowering of its resistivity $\rho$. To facilitate understanding, more concrete explanation will be made with respect to tin dioxide. A crystalline tin dioxide, which was prepared by a vapor phase growth method and doped with a small amount of antimony, had a volume specific resistivity of the order of $10^{-3}$ $\Omega$cm. When this crystalline tin dioxide was finely pulverized by means of a ball mill, the resultant tin dioxide powder had a specific resistivity of the order of $10^2$ $\Omega$cm (measured by the method described in Example 1). The increase of five orders in specific resistivity was attributable to an enormous increase in contact surfaces or boundaries between the finely divided particles, not to any change in internal resistance of the individual particles. It will be understood that the contact resistances at these boundaries serve as series-connected resistances. When the metal oxide powder is allowed to uniformly come into contact with an unsaturated metal halide, the above described resistivity-lowering action of the metal halide is effectively exerted on the contact surfaces of the fine particles, so that the specific resistivity $\rho$ of the powder lowers and approaches $\rho$ of a single crystal of the metal oxide. In fact, the specific resistivity $\rho$ of the aforementioned tin dioxide powder lowered from $10^2$ $\Omega$cm to $10^0$ $\Omega$cm when the powder was once immersed in an aqueous solution of stannous fluoride amounting to 1.0 mol% of the quantity of the tin dioxide powder.

It is an important merit of the present invention that a metal halide treatment conducted at room temperature fully exhibits its resistivity-lowering effect on a metal oxide, meaning that the metal oxide does not need to be heated for lowering of its resistivity. In conventional methods such as the valence control technique, there is the necessity for high temperature to allow thermal diffusion of a dopant into a metal oxide. Necessarily, the metal oxide is heated beyond the highest temperature it has experienced during crystallization thereof, so that the diffusion of the dopant takes place while crystallization of the metal oxide proceeds further.

The advantages of a method according to the invention are summarized as follows.

(1) The resistivity of either an n-type metal oxide semiconductor or a conductive material comprising such a metal oxide can be lowered very easily and simply without using any costly apparatus for heat treatment.

(2) Lowering of the resistivity of an n-type metal oxide semiconductor can be achieved with the accompaniment of substantially no changes in color of the metal oxide. Accordingly it is possible to obtain a white or lightly colored conductive material, particularly a powder material, of low resistivity.

(3) A method of the invention can be combined with a conventional resistivity-lowering method to obtain a conductive material extremely low in specific resistivity.

(4) The metal halide treatment according to the invention can be conducted without the need of precisely controlling the temperature for treatment or the concentration of a dopant. A metal oxide semiconductor or a conductive material of a desired specific resistivity can be obtained simply by controlling the quantity of an unsaturated metal halide (in most cases concentration and/or volume of a solution of the metal halide) to be brought into contact with the metal oxide.

(5) A method of the invention is applicable to various n-type metal oxides with generally similar effects. Furthermore, this method is applicable also to a mixture of n-type metal oxides or a non-powdery conductive material which may take the form of, for example, a thin film coated on a substrate.

What is claimed is:

1. A method of lowering the resistivity of an n-type metal oxide semiconductor, the metal oxide semiconductor being the oxide of a single metal element, being selected from the group consisting of tin dioxide, diindium trioxide and zinc oxide, and being in the form of a fine powder; said method comprising the step of treating the metal oxide semiconductor with an aqueous solution of a metal halide selected from the group consisting of stannous halides and antimony trihalides, in which metal halide the oxidation number of the metal is smaller than the largest oxidation number the metal can take, at a temperature below the thermal decomposition temperature of the metal halide so as to allow the metal oxide semiconductor to generally uniformly come into contact with the metal halide.

2. A method as claimed in claim 1, wherein the treatment of the metal oxide semiconductor comprises the step of wetting the metal oxide semiconductor with a solution of the metal halide.

3. A method as claimed in claim 2, wherein the treatment of the metal oxide semiconductor comprises the step of immersing the metal oxide semiconductor in said solution.

4. A method as claimed in claim 2, wherein the treatment of the metal oxide semiconductor comprises the step of spraying said solution onto the metal oxide semiconductor.

5. A method of lowering the resistivity of a conductive material which comprises as its fundamental component at least one n-type metal oxide semiconductor, the metal oxide semiconductor being the oxide of a single metal element, being selected from the group consisting of tin dioxide, diindium trioxide and zinc oxide, and being in the form of a fine powder; the method comprising the step of treating the conductive material with an aqueous solution of a metal halide selected from the group consisting of stannous halides and antimony trihalides, in which metal halide the oxidation number of the metal is smaller than the largest oxidation number the metal can take, at a temperature below the thermal decomposition temperature of the metal halide so as to allow the conductive material to generally uniformly come into contact with the metal halide.

6. A method as claimed in claim 5, wherein the treatment of the conductive material with the metal halide comprises the step of wetting the conductive material with a solution of the metal halide.

7. A method as claimed in claim 5, wherein the conductive material comprises at least one n-type oxide semiconductor which is doped with a metal element different in valence from the metal of the metal oxide semiconductor subjected to the doping.

* * * * *